(12) United States Patent
Nishimura et al.

(10) Patent No.: US 6,534,808 B2
(45) Date of Patent: Mar. 18, 2003

(54) METAL-INSULATOR-SEMICONDUCTOR PHOTOCELL AND IMAGER

(75) Inventors: Akitoshi Nishimura, Tokyo (JP); Ichiro Fujii, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/758,567

(22) Filed: Jan. 11, 2001

(65) Prior Publication Data

US 2002/0125514 A1 Sep. 12, 2002

Related U.S. Application Data

(60) Provisional application No. 60/177,341, filed on Jan. 19, 2000.

(51) Int. Cl.⁷ ..................... H01L 31/062; H01L 31/113
(52) U.S. Cl. ....................................... 257/290; 257/292
(58) Field of Search ................................ 257/290, 292

(56) References Cited

U.S. PATENT DOCUMENTS 5,204,544 A * 4/1993 Inoue et al.
5,289,023 A * 2/1994 Mead
5,828,118 A * 10/1998 Russell

FOREIGN PATENT DOCUMENTS

JP  10-27896  1/1998

* cited by examiner

Primary Examiner—Stephen D. Meier
(74) Attorney, Agent, or Firm—Carlton H. Hoel; W. James Brady; Frederick J. Telecky, Jr.

(57) ABSTRACT

A photocell for detecting light includes at least two tiers or structures, one disposed over the other, each tier having a metal-insulator-semiconductor (M-I-S) or a semiconductor-insulator-metal (S-I-M) structure. Each M-I-S structure includes a semiconductor diffusion layer capable of developing a depletion region, a thin insulator layer disposed on the diffusion layer, and a contact layer disposed on the thin insulator layer. Each S-I-M structure includes a contact layer, a thin insulator layer disposed on the contact layer, and a semiconductor diffusion layer disposed on the thin insulator layer, the semiconductor layer capable of developing a depletion region. When light is incident on each depletion region, a current indicative of the light detected in each depletion region flows through the respective contact layer. Also provided is a semiconductor-insulator-metal (S-I-M) structure that detects light. Two- and three-tiered photocells made of M-I-S and/or S-I-M structures are also provided. Three-tiered photocells are able to detect blue, green, and red components of incident light. These photocells may be arranged in an array to form a photo-imager.

14 Claims, 5 Drawing Sheets

METAL-INSULATOR-SEMICONDUCTOR PHOTOCELL AND IMAGER

This application claims priority under 35 USC § 119(e)(1) of provisional application numbers 60/177,341 filed Jan. 19, 2000.

TECHNICAL FIELD OF THE INVENTION

This invention relates generally to the field of photocells and photo-imagers, and more particularly to multi-color photocells and imagers.

BACKGROUND OF THE INVENTION

Photocells and photo-imagers (also called "image sensors") made of an array of photocells are used in a wide variety of imaging applications. One type of photo-imager is a CCD (charge-coupled device), in which each photocell is normally sensitive to only one band of wavelengths (i.e., one color). A conventional CCD imager can be complex and require highly accurate timing mechanisms and is therefore expensive to manufacture. Conventional CCDs also require 5–10 volt supplies and are limited in detecting lower-wavelength (e.g., blue light) signals.

One type of imager that operates at a lower voltage, is simpler, and is less expensive to manufacture than the CCD imager is a metal-insulator-semiconductor ("M-I-S," also called "metal-insulator-silicon") imager. An M-I-S imager is made of an array of M-I-S photocells, one of which is shown in a schematic diagram in FIG. 1A. The M-I-S photocell shown in FIG. 1A is derived from the applicants' prior unexamined Japanese patent application JP 10-27896, published Jan. 27, 1998, the disclosure of which is herein incorporated by reference. As the name implies, the M-I-S photocell comprises a metal contact or electrode 120 (also called a gate), an insulator 130, and a semiconductor diffusion layer 140. When a negative drive voltage is applied to diffusion layer 140, a depletion region 150 is formed within diffusion layer 140 in the area below contact 120. This M-I-S structure 100 is disposed on top of a substrate 10, which is typically made from silicon. Insulator 130 is typically made of a thermally grown oxide such as $SiO_2$. When thin, between 20 and 50 Å, typically 30 Å, insulator 130 acts as a dielectric material and is light-transparent. Contact 120 is also light-transparent, typically made of a metal, such as $SnO_2$, or heavily doped polysilicon, and has a typical thickness of 2000 Å, when made of polysilicon. The resistivity of contact 120 varies depending on the material: for polysilicon, it has a resistivity of 100Ω–200Ω per square; for $SnO_2$, it has a resistivity of approximately 10Ω–20Ω per square. When substrate 10 comprises n-Si, then diffusion layer 140 comprises single-crystal p-Si, and contact 120 is an n-contact or a p-contact. The photocell generates current when light transmits through contact 120 and insulator 130 and is incident on depletion region 150 creating electron-hole pairs.

The M-I-S photocell can be arranged in an array to form an M-I-S photo-imager, a portion of which is shown in FIG. 1B. Semiconductor diffusion layers 140 are arranged in strips over substrate 10. Insulator 130 is disposed over diffusion layers 140. Between the diffusion layers are isolation strips 160 made by depositing more thickly the insulator material directly on substrate 10. (These strips 160 may also be made using a LOCOS (local oxidization of silicon) process.) Perpendicular to the diffusion layers and isolation strips are strips of contact 120. The depletion regions 150 are formed at the intersections of the contact 120 and the diffusion layers 140.

The quantum efficiency of each photocell with a 2000 Å polysilicon contact layer is shown in TABLE 1 as a function of color and wavelength.

TABLE 1

| Color | Wavelength (Å) | Quantum Efficiency |
|---|---|---|
| Blue | 4000 | 0.014 |
| Green | 5400 | 0.36 |
| Red | 7000 | 0.60 |
| Near Infrared | 9000 | 0.75 |
| Infrared | 12000 | 0.026 |

Although providing a significant improvement over CCD imagers with respect to power dissipation and the detection of some colors, this M-I-S photo-imager with a 2000 Å polysilicon contact does not detect blue light very well, as demonstrated in TABLE 1, and is not able to separate out more than one color.

SUMMARY OF THE INVENTION

Therefore, a need has arisen for an improved photo-imager which is capable of detecting several colors, including blue light. In accordance with the present invention, a device, such as a photocell, for detecting light includes at least two structures or tiers, one disposed over the other, each detecting a different wavelength of light. Each structure could be an M-I-S structure or a semiconductor-insulator-metal (S-I-M) structure.

Preferably, each M-I-S structure includes a semiconductor diffusion layer capable of developing a depletion region, a thin insulator layer disposed on the diffusion layer, and a contact layer disposed on the thin insulator layer. Each S-I-M structure includes a contact layer, a thin insulator layer disposed on the contact layer, and a semiconductor diffusion layer disposed on the thin insulator layer, the diffusion layer capable of developing a depletion region. When light is incident on each M-I-S or S-I-M depletion region, a current indicative of the light detected in each M-I-S or S-I-M structure flows through the respective contact layer.

A photo-imager according to the present invention includes an array of photocells each photocell including the two M-I-S or S-I-M structures.

Preferably, the wavelength detected by the bottom tier is longer than the wavelength detected by the top tier.

Preferably, a third M-I-S or S-I-M structure (or tier) is disposed over the first two tiers, and all three tiers detect different wavelengths. Preferably, the third tier has a metal-insulator-semiconductor or semiconductor-insulator-metal structure analogous to those of the first two tiers.

Preferably, the top, middle, and bottom tiers of the three-tiered device detect light having progressively longer wavelengths. Preferably, the top tier detects mainly blue light, the middle tier mainly green light, and the bottom tier mainly red light.

Preferred embodiments of this three-tiered device include all M-I-S structures, all S-I-M structures, an M-I-S/S-I-M/M-I-S (in order from top to bottom) structure, an S-I-M/M-I-S/S-I-M structure, and an S-I-M/S-I-M/M-I-S structure.

Also in accordance with the present invention is a device, such as a photocell, for detecting light that includes at least one M-I-S structure. The M-I-S structure includes a semiconductor diffusion layer, a thin insulator layer disposed on the diffusion layer, and a contact layer disposed on the thin insulator layer. The diffusion layer is made of polysilicon or amorphous silicon and is capable of developing a depletion region. When light is incident on the depletion region, a current indicative of the light detected in the depletion region flows through the contact layer. Preferably, a photo-imager according to the present invention includes an array of photocells each having such an M-I-S structure.

Also in accordance with the present invention is a device, such as a photocell, for detecting light that includes an S-I-M structure. The S-I-M structure includes a contact layer, a thin insulator layer disposed on the contact layer, and a semiconductor diffusion layer disposed on the thin insulator layer. The diffusion layer is capable of developing a depletion region. When light is incident on the depletion region, a current indicative of the light detected in the depletion region flows through the contact layer. Preferably, a photo-imager according to the present invention includes an array of photocells each having an S-I-M structure. The diffusion layer can be made of polysilicon or amorphous silicon.

Also in accordance with the present invention are methods for fabricating a device, such as a photocell, for detecting light and a photo-imager comprising an array of those photocells. One method includes forming on a substrate three tiers or structures, one disposed over the next, each detecting a different wavelength of light. Each tier could be an M-I-S or an S-I-M structure. Preferably, the top, middle, and bottom tiers detect light having progressively longer wavelengths. Preferably, the top tier detects mainly blue light, the middle tier mainly green light, and the bottom tier mainly red light.

A second method includes fabricating a photocell device on a substrate based on an S-I-M structure. The S-I-M structure is fabricated by forming a contact layer on the substrate, forming a thin insulator layer on the contact layer, and forming a semiconductor diffusion layer on the thin insulator layer, the diffusion layer capable of developing a depletion region. When light is incident on the depletion region, a current indicative of the light detected in the depletion region flows through the contact layer.

The present invention provides various advantages. One advantage is that the three-tiered devices detect three main colors, and do so relatively inexpensively and at a lower voltage compared with conventional devices. Another advantage is that the S-I-M structure and the two-and three-tiered devices are able to detect blue light better than conventional devices.

Other technical advantages of the present invention will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

The photocell described in the applicants' prior Japanese patent application was an M-I-S structure which was incapable of separating out colors. The photocell of the present invention is able to detect blue light and to separate out more than one color. This multi-color separation capability derives from the photocell being made up of more than one M-I-S or S-I-M structure (or tier), in which each tier detects mainly one color.

Figure 1A:
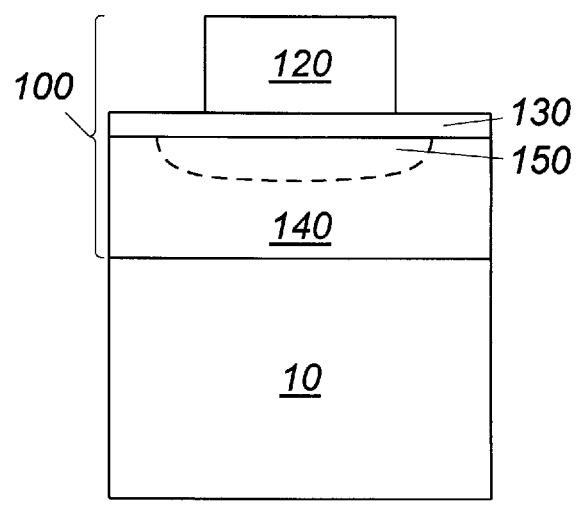
FIGS. 1A and 1B are schematic diagrams of a prior art M-I-S photocell and imager, respectively.
Figure 1B:
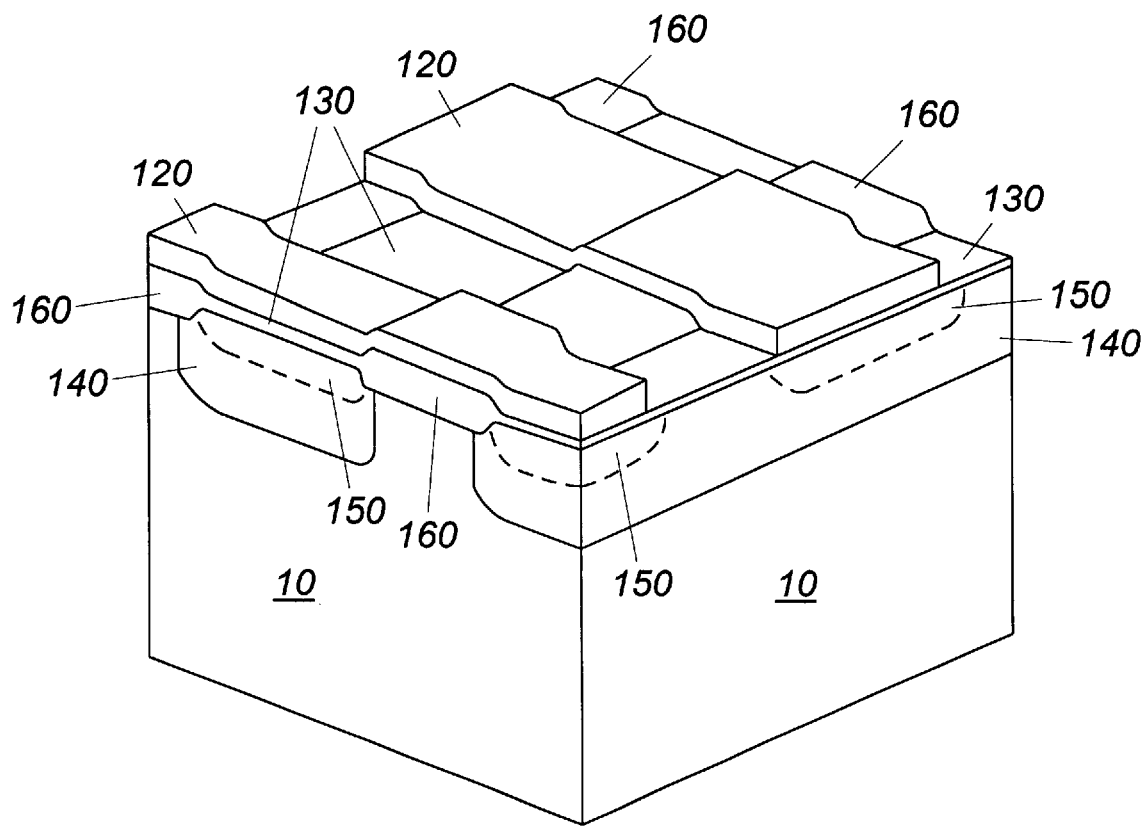
Figure 2A:
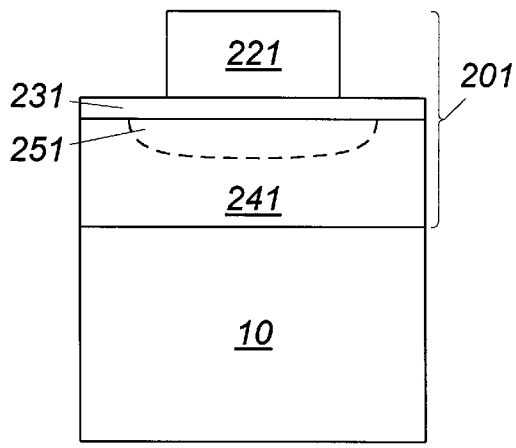
FIGS. 2A–2C are schematic diagrams of M-I-S photocells in accordance with two embodiments of the present invention.

The foundation for the photocell of the present invention, M-I-S structure 201, is illustrated in FIG. 2A. It has a structure similar to that of the applicants' prior structure illustrated in FIG. 1A, and includes a metal or polysilicon contact layer 221, an insulator layer 231, and a semiconductor diffusion layer 241 disposed on substrate 10. Diffusion layer 241 is capable of developing depletion region 251. As in applicants' prior Japanese patent application, substrate 10 is typically made from silicon, and is typically n-Si, although it is possible for substrate 10 to be p-Si.

In applicants' prior device, the diffusion layer was made of lightly-doped ($\sim 10^{15}$–$10^{16}$/cm$^3$), single-crystal Si, but in the present invention, it may also be made of polysilicon or amorphous silicon.

Insulator 231 is thin, between 20 and 50 Å, preferably around 30 Å, and is typically made of SiO$_2$ or SINO, which may be thermally grown or formed using chemical vapor deposition (CVD) or some other deposition method. Because insulator 231 is so thin, it acts as a dielectric and allows current to flow between the depletion region and the contact. This is known as a direct tunneling phenomenon. (The thickness of layer 231 may even be greater than 50 Å, so long as the layer exhibits this direct tunneling phenomenon.) Insulator 231 is also light-transparent.

Contact 221 is light-transparent, and is typically made of a metal, a metal-oxide, such as SnO$_2$, or heavily doped ($\geq 10^{20}$/cm$^3$) polysilicon. The contact may be formed using CVD. If made of polysilicon, the resistance of the contact can be controlled by varying the doping level. Because the transmission of light through polysilicon depends on the thickness of the polysilicon, the thickness of contact 221 varies depending on which color light is desired to be detected, as will be discussed below, and on the capacitance of the contact (the thicker the contact, the lower the capacitance). Preferably, the thickness of the polysilicon contact ranges from 500 Å–1000 Å. In contrast, because SnO$_2$ is nearly 100% transmissive in the visible region, the thickness of contact 221 made from SnO$_2$ does not matter as much, and only affects the capacitance. In describing exemplary embodiments below, the contact will generally be assumed to be made of polysilicon, although an SnO$_2$ contact would also work.

Preferably substrate 10 comprises n-Si, in which case diffusion layer 241 is p-Si (single-crystal, polysilicon, or amorphous silicon), and contact 221 is an n-contact, although a p-contact can also work. This is the conductivity arrangement that will be described hereinafter, although it is possible for substrate 10 to be p-Si, diffusion layer 241 to be n-Si, and contact 221 to be a p-contact or an n-contact.

Figure 2B:
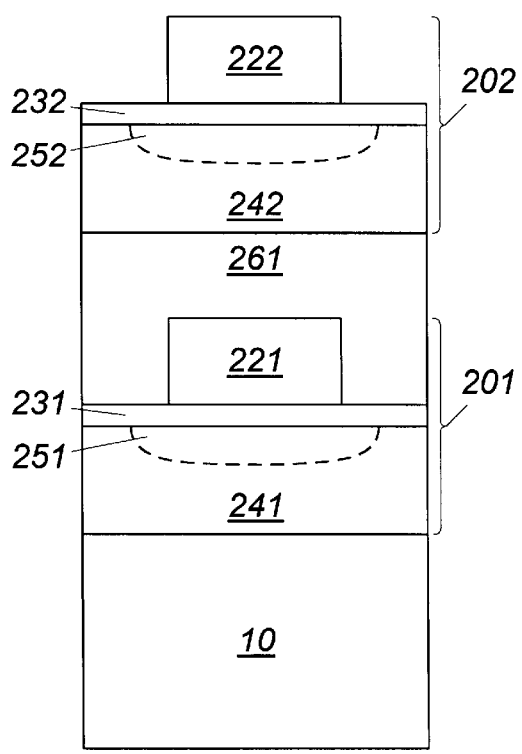

In order to separate out wavelength bands, at least one other tier is required. FIG. 2B shows M-I-S structure 202 stacked on top of M-I-S structure 201, with a thick insulator layer 261 between the two tiers to isolate the two M-I-S structures from each other. The structure of M-I-S structure 202 is similar to that of M-I-S structure 201 and comprises contact 222, insulator layer 232, and semiconductor diffusion layer 242. Diffusion layer 242 is capable of developing depletion region 252. Insulator layer 232 has the same structure and is made of the same materials as insulator layer 231. Contact 222 is made of the same materials as contact 221, but its thickness may differ depending on the wavelength of light desired to be detected by the two-tiered photocell.

Because diffusion layer 242 must be grown on top of insulator layer 261, it cannot be made of single-crystal silicon, and therefore is typically made of polysilicon or amorphous silicon. As with contacts 221, 222, the thickness of diffusion layer 242 may vary depending on which color light is desired to be detected by the photocell.

Insulator layer 261 is light-transparent and is typically made of SiO$_2$ deposited using CVD or some other deposition method. Insulator layer 261 is much thicker (at least 1000 Å, and more typically up to 5000 Å) than either of the thin insulator layers 231, 232. In this way, insulator layer 261 acts as an isolation layer. Because the deposited SiO$_2$ is light-transparent, the thickness of insulator layer 261 has very little effect upon the desired color light to be detected. The thickness of insulator layer 261 does affect the capacitance of the M-I-S structure, however—the thicker the layer, the lower the capacitance.

One way of processing stacked M-I-S structures is to use chemical mechanical polishing (CMP) to polish the top of the insulator layer between the M-I-S structures. It is desired that thick insulator layer 261 be flat before depositing diffusion layer 242 on top of it. CMP therefore helps keep the array of photocells flat when arranged in an array to form a photo-imager.

When a negative voltage on the order of 1–2 volts is applied to diffusion layers 241, 242, depletion regions 251, 252 develop in the diffusion layers. Light enters the device from the top, travels through contact 222 and insulator layer 232 and is incident on depletion region 252 generating electron-hole pairs. The current generated by these electron-hole pairs is then measured. The brighter the incident light, the more electron-hole pairs are generated and the larger the current detected via contact 222.

Light continues to travel through insulator layer 261, contact 221, and insulator layer 231, until it is incident on depletion region 251 in diffusion layer 241. The electron-hole pairs generated in depletion region 251 generate a current to be detected via contact 221.

The currents generated at contacts 221, 222 vary depending on the thicknesses of the various layers, as well as the wavelengths detected. Generally, the farther the light travels through the different layers, the lower is the current that is generated at the contacts. (The quantity of light passing through the material is proportional to $e^{-aT}$, where T is the thickness of the material of the layer and a is a constant, the value of which depends on the material type. The quantity of detected light is proportional to the quantity of light reaching the depletion region.) In addition, longer wavelengths are capable of generating electron-hole pairs deeper into the M-I-S structure.

Assuming contact 222 has a thickness of about 500 Å, light having mostly blue, some green, and a small amount of red components will be incident on depletion region 252 and detected at contact 222. Depending on the thicknesses of diffusion layer 242 and contact 221, the light that reaches depletion region 251 will have mostly green and some red components, because the blue component will have been absorbed by the intervening layers and because blue light cannot be detected below certain depths. For smaller thicknesses of diffusion layer 242 and contact 221, proportionally more green light will be incident on depletion region 251 and detected at contact 221, whereas for larger thicknesses of these intervening layers, proportionally more red light will be detected.

A photocell can be designed by knowing the thicknesses of the layers of the M-I-S structures, and the photocell can be characterized (or calibrated) using silicon absorption theory in terms of the ratios of the light components that are detected at each contact for known intensities of incident light. Once characterized, the photocell can then be used to determine the actual values of the components of the desired incident light.

Figure 2C:
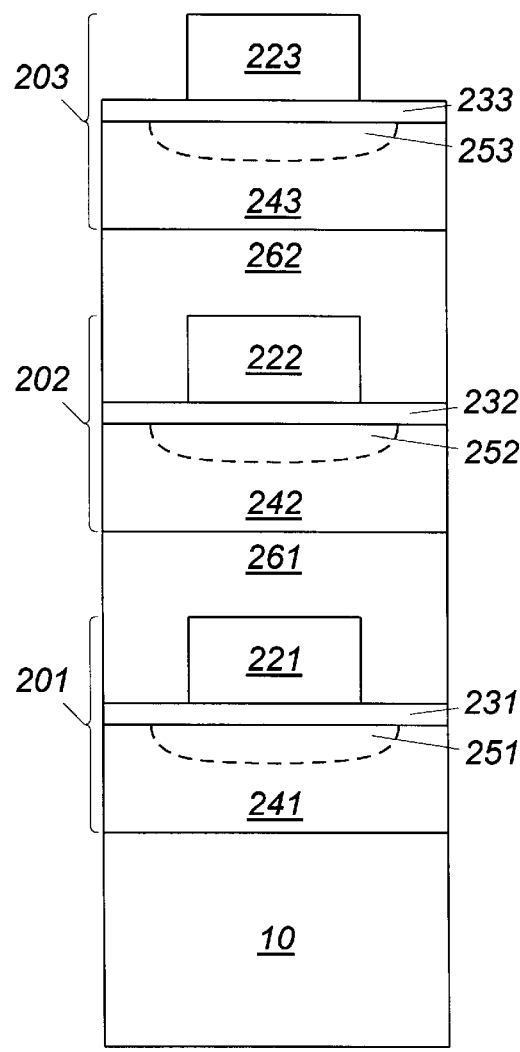

With only two M-I-S tiers, the relative intensities of only two colors can be determined. In order to fully determine the intensities of the blue, green, and red components of incident light, a third tier is needed. Such an arrangement using an M-I-S structure is illustrated in FIG. 2C.

The third M-I-S structure 203 comprises contact 223, insulator layer 233, and semiconductor diffusion layer 243, which is capable of developing depletion region 253. Insulator layer 262 may also be used to isolate M-I-S structure 203 from M-I-S structure 202. The materials that comprise M-I-S structure 203 are the same as those previously described for M-I-S structure 202, however the thicknesses of contact 223 and diffusion layer 243 may differ, as explained above.

Assuming contact 223 has a thickness of about 500 Å, light having mostly blue, some green, and a small amount of red components will be incident on depletion region 253 and detected at contact 223. Depending on the thicknesses of diffusion layer 243 and contact layer 222, the light that reaches depletion region 252 will have mostly green and some red components, because the blue component will have been absorbed by the intervening layers. For smaller thicknesses of diffusion layer 243 and contact layer 222, proportionally more green light will be incident in depletion region 252 and detected at contact 222, whereas for larger thicknesses of these intervening layers, proportionally more red light will be incident there. Similarly, depending on the thicknesses of diffusion layer 242 and contact layer 221, the light that reaches depletion region 251 will have nearly all red components, because the green component will have been absorbed by the intervening layers (although for smaller thicknesses of diffusion layer 242 and contact layer 221, there may be a small amount of green light incident on depletion region 251 and detected at contact 221).

The three detected currents at contacts 221, 222, 223 can then be used with the characterization or calibration developed for the photocell to determine the ratios of blue, green, and red light in the incident light.

Figure 3A:
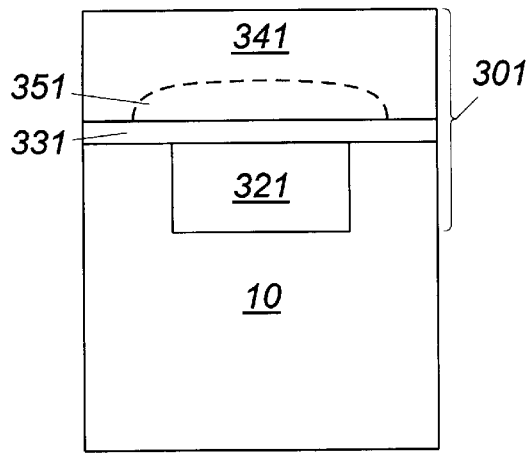
FIGS. 3A–3C are schematic diagrams of S-I-M photocells in accordance with three embodiments of the present invention.

As an alternative to using M-I-S structures, an S-I-M structure can be used. Shown in FIG. 3A is S-I-M structure 301, which is the M-I-S structure turned over. S-I-M structure 301 includes semiconductor diffusion layer 341, which is capable of developing depletion region 351, insulator 331, and contact 321. Except for the diffusion layer, the materials used for these layers can be the same as those for the M-I-S structures. Because diffusion layer 341 is disposed on top of insulator layer 331, it cannot be made of single-crystal silicon, and therefore is typically made of polysilicon or amorphous silicon.

As with the other thin insulator layers, insulator layer 331 is also approximately 30 Å thick, with contact 321 and diffusion layer 341 having variable thickness depending on the preferred wavelengths to be detected. One benefit of this S-I-M structure is that the photo-sensitive layer (comprising diffusion layer 341 and depletion region 351) is on the top of the device and therefore more light is incident on the depletion region than with the M-I-S structures. The light generates electron-hole pairs in the depletion region generating a current which can be detected via contact 321. Because the photo-sensitive layer is on top, the S-I-M photocell may be sensitive to a range of wavelengths different from that of a photocell having a single M-I-S structure would be.

Figure 3B:
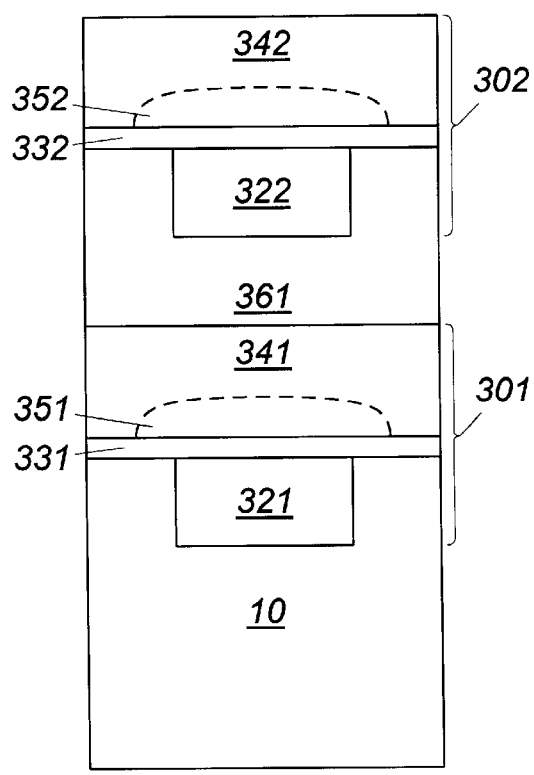

S-I-M structures can also be stacked one on top of another in a manner analogous to that of M-I-S structures. Thus, the device shown in FIG. 3B is analogous to the photocell illustrated in FIG. 2B of two stacked M-I-S tiers. The device of FIG. 3B includes two stacked S-I-M structures 301, 302 on substrate 10. S-I-M structure 302 includes contact layer 322, thin insulator layer 332, and semiconductor diffusion layer 342, which is capable of developing depletion region 352. This device is fabricated by disposing S-I-M structure 302 over S-I-M structure 301 of FIG. 3A and placing insulator layer 361 between the two S-I-M structures. As with the photocell of FIG. 2B, each of the S-I-M tiers 301, 302 detects different wavelengths of light, with tier 302 detecting shorter wavelengths and tier 301 detecting longer wavelengths.

Figure 3C:
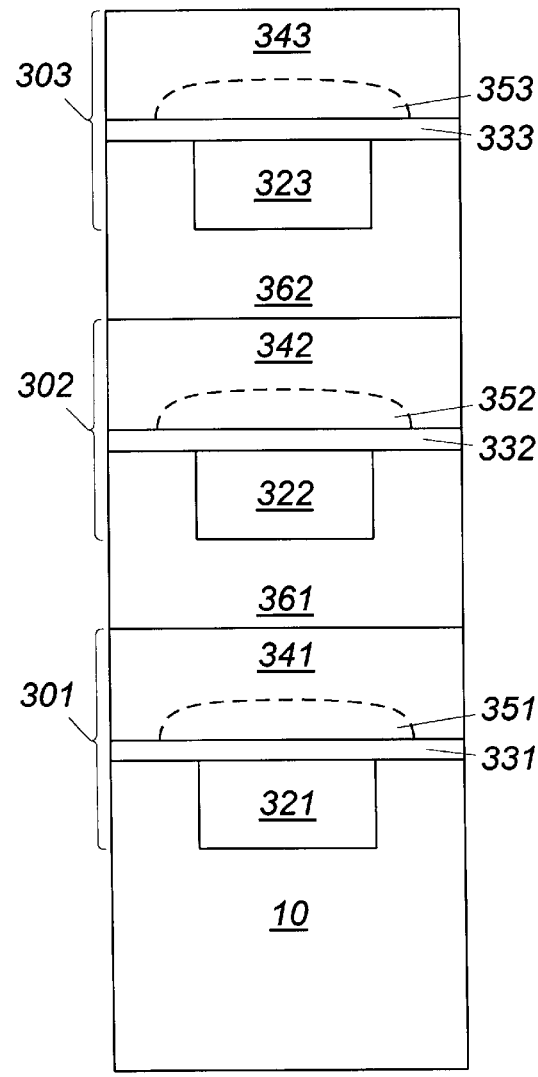

A photocell that adds a third S-I-M tier to that in FIG. 3B is illustrated in FIG. 3C. This photocell includes S-I-M tiers 301, 302 as in FIG. 3B and adds S-I-M structure 303. This third tier includes contact layer 323, thin insulator layer 333, and semiconductor diffusion layer 343, which is capable of developing depletion region 353. Insulator layer 362 isolates S-I-M structure 303 from S-I-M structure 302. The materials used in this tier can be the same as those used in S-I-M tiers 301 and 302 and the M-I-S tiers previously discussed, and the thicknesses of diffusion layers 341, 342, 343 and contacts 321, 322,323 can vary according to the desired range of wavelengths to be detected.

Like the three-tiered M-I-S photocell of FIG. 2C, the three-tiered S-I-M photocell of FIG. 3C can be designed to detect blue, green, and red light components. In S-I-M structure 303, light having mostly blue, some green, and a small amount of red components will be incident on depletion region 353 and detected at contact 323. Depending on the thicknesses of contact layer 323 and diffusion layer 342, the light that reaches depletion region 352 will have mostly green and some red components, because the blue component will have been absorbed by the intervening layers. For smaller thicknesses of contact layer 323 and diffusion layer 342, proportionally more green light will be incident on depletion region 352 and detected at contact 322, whereas for larger thicknesses of these intervening layers, proportionally more red light will be detected. Similarly, depending on the thicknesses of contact layer 322 and diffusion layer 341, the light that reaches depletion region 351 will have nearly all red components, because the green component will have likely been nearly completely absorbed by the intervening layers, which will be detected at contact 321.

The three detected currents at contacts 321, 322, 323 can then be used with the characterization or calibration developed for the photocell to determine the ratios of blue, green, and red light in the incident light.

Figures 4A, 4B:
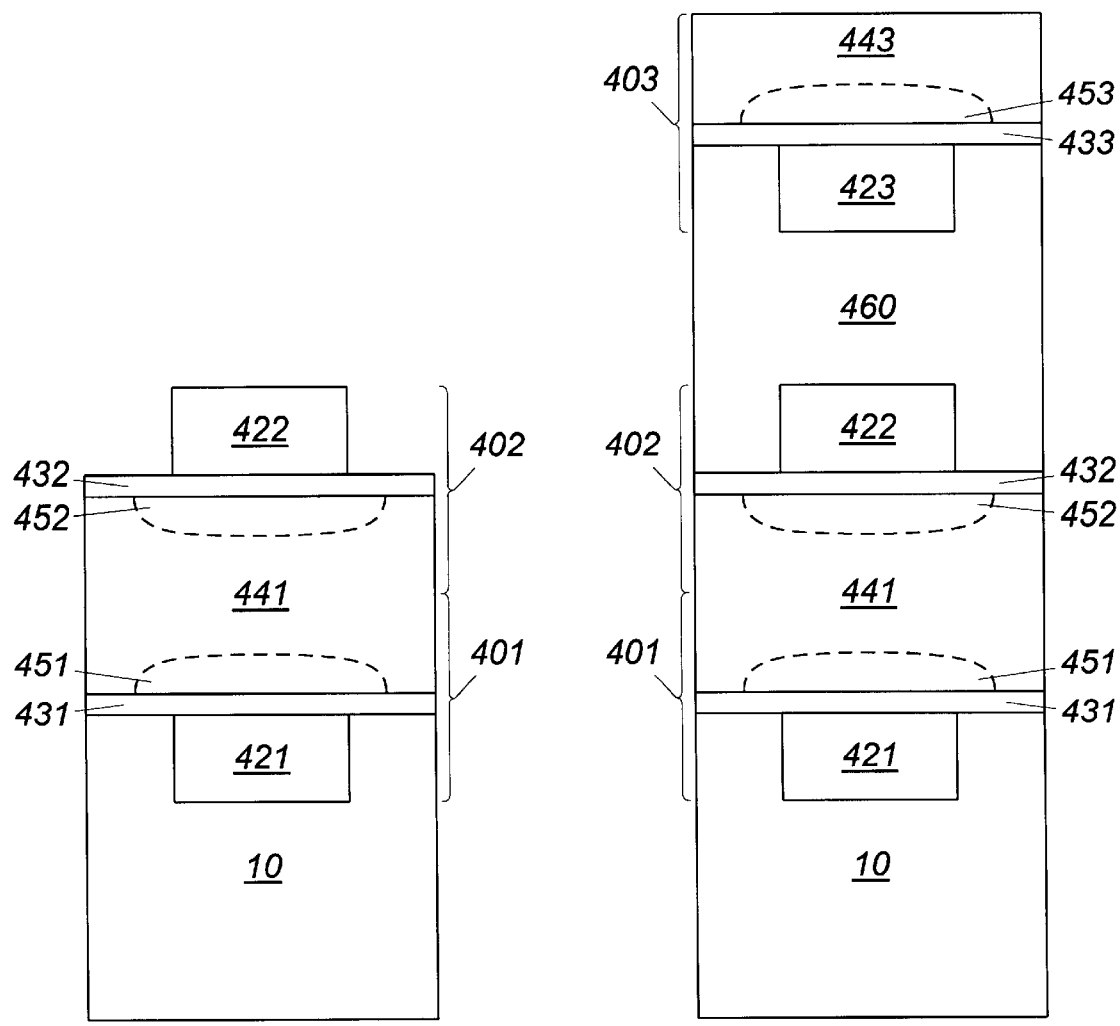
FIGS. 4A, 4B, 5, and 6 are schematic diagrams of several embodiments of hybrid M-I-S/S-I-M photocells in accordance with the present invention.

S-I-M and M-I-S tiers can be mixed to form a two-tiered "hybrid" photocell. FIG. 4A illustrates M-I-S structure 402 disposed over S-I-M structure 401. Because this two-tiered device contemplates having two semiconductor diffusion layers one on top of the other, isolation is not needed between the two structures, and the diffusion layers can be combined to form one thicker diffusion layer 441, which is capable of developing two depletion regions 451, 452. Thus, S-I-M structure 401 constructively includes the portion of diffusion layer 441 having depletion region 451, insulator 431, and contact 421. M-I-S structure 402 constructively includes the other portion of diffusion layer 441 which contains depletion region 452, insulator 432, and contact 422.

The two-tiered photocell of FIG. 4A operates in a manner similar to that of the two-tiered photocell of FIG. 2B. Light incident on the photocell transmits through contact 422 and insulator 432 and generates electron-hole pairs in depletion region 452 which generate a current that is detected at contact 422. Longer-wavelength light continues through diffusion layer 441 and generates electron-hole pairs in depletion region 451 which generate a current that is detected at contact 421.

Another embodiment of a two-tiered hybrid photocell (not illustrated) may include an S-I-M structure on top of an M-I-S structure. In that case, a thick insulator layer is necessary to isolate the two tiers from each other, otherwise the two contacts would touch each other.

S-I-M and M-I-S structures can also be mixed to form a three-tiered hybrid photocell. FIG. 4B illustrates the two-tiered hybrid photocell of FIG. 4A with S-I-M structure 403 disposed over M-I-S structure 402. S-I-M structure 403 includes semiconductor diffusion layer 443, which is capable of developing depletion region 453, insulator 433, and contact 423. As was just mentioned with regard to having an S-I-M structure on top of an M-I-S structure, a thick insulator layer is necessary to isolate the two tiers from each other, otherwise the contacts of the two tiers would touch each other. Insulator layer 460 serves to isolate contacts 422 and 423.

The three-tiered hybrid photocell of FIG. 4B operates in a manner similar to that of the three-tiered photocells of FIGS. 2C and 3C. In S-I-M structure 403, light having mostly blue, some green, and a small amount of red components will be incident on depletion region 453 and detected at contact 423. Depending on the thicknesses of contact layers 423 and 422, the light that is incident on depletion region 452 will have mostly green and some red components, because the blue component will have been absorbed by the intervening layers. For smaller thicknesses of contact layers 423 and 422, proportionally more green light will be incident on depletion region 452 and detected at contact 422, whereas for larger thicknesses of these intervening layers, proportionally more red light will be detected. Then, as in FIG. 4A, longer-wavelength light (red) continues through the diffusion layer 441 and generates electron-hole pairs in depletion region 451 which generate a current that is detected at contact 421.

The three detected currents at contacts 421, 422, 423 can then be used with the characterization or calibration developed for the photocell to determine the ratios of blue, green, and red light in the incident light.

Figure 5:
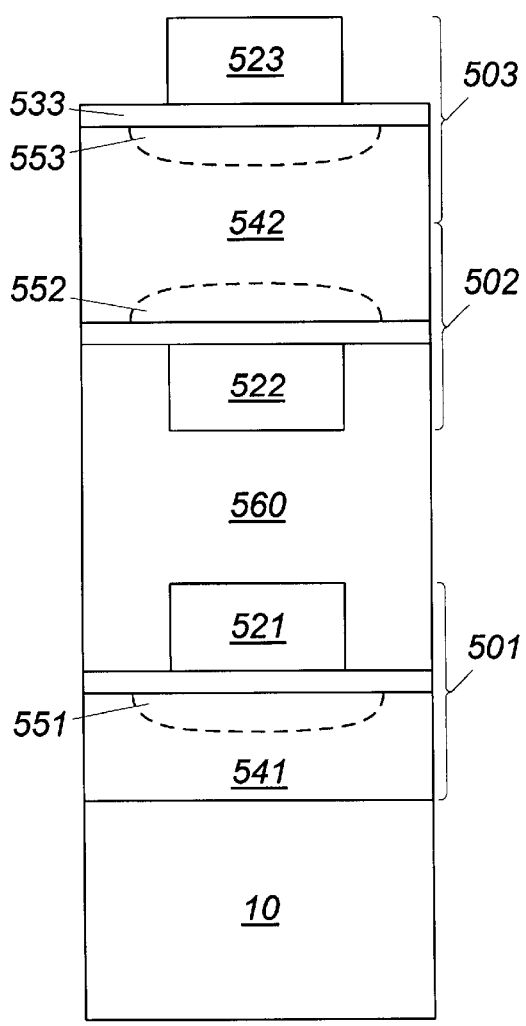
Figure 6:
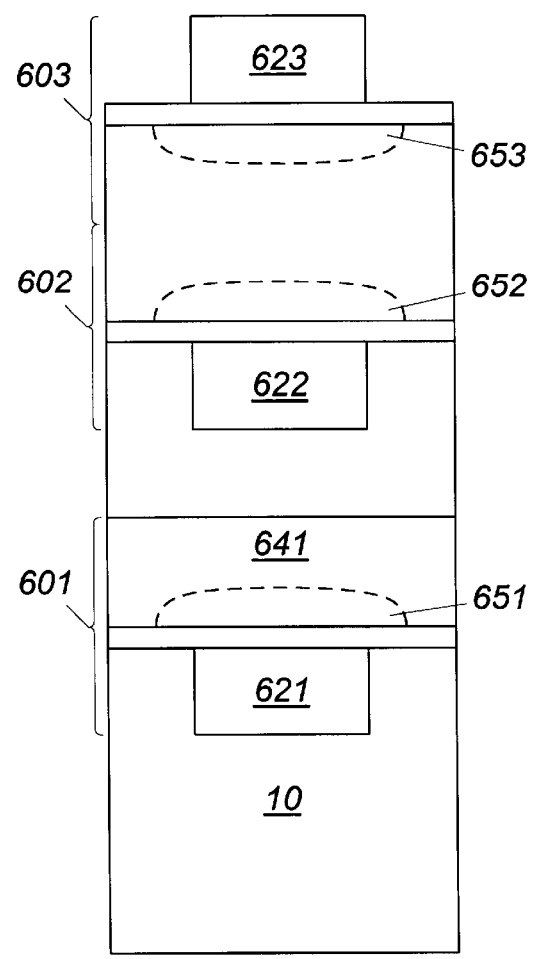

Other permutations of S-I-M and M-I-S structures can be used in a three-tiered hybrid photocell. Two photocells are shown in FIGS. 5 and 6. FIG. 5 illustrates the three-tiered M-I-S photocell of FIG. 2C with an S-I-M tier substituted for the middle M-I-S tier. M-I-S structure 501 is analogous to M-I-S structure 201. The M-I-S-over-S-I-M hybrid structure comprising structures 503 and 502 is similar to the hybrid structure in FIG. 4A. Light incident on the photocell transmits through contact 523 and insulator 533 and generates electron-hole pairs in depletion region 553 which generate a current that is detected at contact 523. This light has mostly blue, some green, and a small amount of red components. Longer-wavelength light continues through the diffusion layer 542 and generates electron-hole pairs in depletion region 552 which generate a current that is detected at contact 522. Depending on the thickness of diffusion layer 542, the light that reaches depletion region 552 will have mostly green and some red components, because the blue component will have been absorbed by the diffusion layer. For a thinner diffusion layer 542, proportionally more green light will be detected at contact 522, whereas for a thicker diffusion layer 542, proportionally more red light will be detected. Then, depending on the thicknesses of contact layers 522 and 521, the light that is incident on depletion region 551 will be nearly all red, because the green component will have been absorbed by the intervening layers. For smaller thicknesses of contact layers 522 and 521, a little more green light may be incident on depletion region 551 and detected at contact 521, whereas for larger thicknesses of these intervening layers, all the green light will have been absorbed and only red light will be detected. The three detected currents at contacts 521, 522, 523 can then be used with the characterization or calibration developed for the photocell to determine the ratios of blue, green, and red light in the incident light.

FIG. 6 illustrates the three-tiered photocell of FIG. 5 with S-I-M structure 601 substituted for bottom M-I-S structure 501. This photocell operates in the same manner as the photocell of FIG. 5 for the light incident on the first two depletion regions 653, 652 and detected at the first two contacts 623, 622, because the structures 602 and 603 are analogous to structures 502 and 503. However, the light incident on depletion region 651 and detected at contact 621 may have a different proportion of red and green light because of a shortened path length to depletion region 651, if, for instance, semiconductor diffusion layer 641 is closer to the top of the photocell, depending on the thicknesses of the intervening contact layers. Once the photocell in FIG. 6 is characterized or calibrated, the three detected currents at contacts 621, 622, 623 can then be used to determine the ratios of blue, green, and red light components in the incident light.

Other arrangements of hybrid photocells have not been illustrated, but follow from the general concept of the photocells discussed. For instance, an M-I-S/M-I-S/S-I-M (in order from top to bottom) photocell can be fabricated by disposing an M-I-S structure on the hybrid photocell of FIG. 4A. An S-I-M/M-I-S/M-I-S photocell can be fabricated by disposing an S-I-M structure on the two-tiered M-I-S photocell of FIG. 2B. And an S-I-M/S-I-M/M-I-S photocell can be fabricated by substituting an S-I-M structure for the M-I-S structure on the top tier of the hybrid photocell of FIG. 5.

The photocell devices of the present invention include one-, two-, or three-tiered M-I-S or S-I-M structures. The three-tiered devices are capable of detecting the blue, green, and red components of incident light. In addition, photo-imagers can be fabricated using an array of the photocells. For standard TV, an imager may typically have an 800×500 pixel array, which would translate into a 780×488 usable array space. For high definition TV (HDTV), an imager may typically have a 2000×1000 pixel array. The photocells and photo-imagers according to the present invention are an improvement over CCD imagers in the prior art because these devices operate at lower voltage, are easier to fabricate, and are more sensitive to blue light, and each multi-tier photocell can detect more than one wavelength of light.

Although the present invention has been described in detail by reference to specific embodiments thereof, it should be understood that various changes, substitutions, and alterations can be made to such embodiments without departing from the spirit and scope of the invention as defined by the appended claims.

What is claimed is:
1. A device for detecting light, comprising:
 a first tier for detecting a first wavelength of light, the first tier comprising a metal-insulator-semiconductor (M-I-S) structure or a semiconductor-insulator-metal (S-I-M) structure; and a second tier for detecting a second wavelength of light, the second tier disposed over the first tier and comprising an M-I-S structure or an S-I-M structure, wherein the first and second wavelengths are different.

2. The device according to claim 1, wherein:

each M-I-S structure comprises:
- a first semiconductor diffusion layer capable of developing a first depletion region;
- a first thin insulator layer disposed on the first diffusion layer; and
- a first contact layer disposed on the first thin insulator layer; and each S-I-M structure comprises:
- a second contact layer;
- a second thin insulator layer disposed on the second contact layer; and
- a second semiconductor diffusion layer disposed on the second thin insulator layer, the second diffusion layer capable of developing a second depletion region, wherein light incident on each depletion region causes a current indicative of the light detected by each structure to flow through the respective contact layer.

3. A photo-imager comprising an array of devices according to claim 1.

4. The device according to claim 1, wherein the second and first tiers respectively detect progressively longer wavelengths of light.

5. The device according to claim 1, further comprising:

a third tier for detecting a third wavelength of light, the third tier disposed over the second tier and comprising an M-I-S structure or an S-I-M structure, wherein the third wavelength differs from the first and second wavelengths.

6. The device according to claim 5, wherein:

each M-I-S structure comprises:
- a first semiconductor diffusion layer capable of developing a first depletion region;
- a first thin insulator layer disposed on the first diffusion layer; and
- a first contact layer disposed on the first thin insulator layer; and each S-I-M structure comprises:
- a second contact layer;
- a second thin insulator layer disposed on the second contact layer; and
- a second semiconductor diffusion layer disposed on the second thin insulator layer, the second diffusion layer capable of developing a second depletion region, wherein light incident on each depletion region causes a current indicative of the light detected by each structure to flow through the respective contact layer.

7. A photo-imager comprising an array of devices according to claim 5.

8. The device according to claim 5, wherein the third, second, and first tiers respectively detect progressively longer wavelengths of light.

9. The device according to claim 8, wherein the third, second, and first tiers respectively detect mainly blue, mainly green, and mainly red light.

10. The device according to claim 5, wherein the first, second, and third tiers comprise M-I-S structures.

11. The device according to claim 5, wherein the first, second, and third tiers comprise S-I-M structures.

12. The device according to claim 5, wherein the first and third tiers comprise M-I-S structures and the second tier comprises an S-I-M structure.

13. The device according to claim 5, wherein the first and third tiers comprise S-I-M structures and the second tier comprises an M-I-S structure.

14. The device according to claim 5, wherein the first and second tiers comprise S-I-M structures and the third tier comprises an M-I-S structure.

* * * * *